(12) United States Patent
Hong et al.

(10) Patent No.: US 8,957,142 B2
(45) Date of Patent: Feb. 17, 2015

(54) POLYAMIDE RESIN COMPOSITION HAVING EXCELLENT PHOTOSTABILITY AND DISCOLORATION RESISTANCE

(71) Applicant: Cheil Industries Inc., Gumi-si (KR)

(72) Inventors: Sang Hyun Hong, Uiwang-si (KR); Sang Hwa Lee, Uiwang-si (KR); Jong Cheol Lim, Uiwang-si (KR); Yoo Jin Jung, Uiwang-si (KR); Sang Kyun Lim, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 14/067,139

(22) Filed: Oct. 30, 2013

(65) Prior Publication Data

US 2014/0221539 A1 Aug. 7, 2014

(30) Foreign Application Priority Data

Feb. 1, 2013 (KR) ........................ 10-2013-0012017

(51) Int. Cl.
| | | |
|---|---|---|
| *C08G 18/77* | (2006.01) | |
| *C08K 7/14* | (2006.01) | |
| *C08K 3/22* | (2006.01) | |
| *C08K 5/5313* | (2006.01) | |

(52) U.S. Cl.
CPC ... *C08K 7/14* (2013.01); *C08K 3/22* (2013.01); *C08K 5/5313* (2013.01)
USPC ........................................................ 524/115

(58) Field of Classification Search
USPC ........................................................ 524/115
See application file for complete search history.

(56) References Cited

U.S. PATENT DOCUMENTS

| | | | |
|---|---|---|---|
| 5,849,380 A | 12/1998 | Kashiba et al. | |
| 8,426,549 B2 | 4/2013 | Ogasawara | |
| 2004/0102604 A1 | 5/2004 | Bassler et al. | |
| 2004/0175466 A1 | 9/2004 | Douglas et al. | |
| 2005/0113532 A1 | 5/2005 | Fish, Jr. et al. | |
| 2010/0113656 A1* | 5/2010 | Saga | 524/126 |
| 2010/0227957 A1 | 9/2010 | Fujii | |
| 2012/0165448 A1 | 6/2012 | Lee et al. | |
| 2012/0305287 A1* | 12/2012 | Ni | 174/120 SR |
| 2013/0172453 A1* | 7/2013 | Lee et al. | 524/100 |
| 2013/0281587 A1 | 10/2013 | Shim et al. | |

FOREIGN PATENT DOCUMENTS

| | | |
|---|---|---|
| JP | 1995-228776 | 8/1995 |
| JP | 2000-204244 A | 7/2000 |
| JP | 2002-294070 A | 10/2002 |
| JP | 2004-075994 A | 3/2004 |
| JP | 2007-218980 | 8/2007 |
| KR | 2007-7026437 A | 12/2007 |
| WO | 03/085029 A1 | 10/2003 |

OTHER PUBLICATIONS

Full Translation of Niguchi et al. JP 2007-218980, pp. 1-32.
Office Action in commonly owned U.S. Appl. No. 13/728,177 mailed Oct. 23, 2013, pp. 1-7.
Office Action in commonly owned U.S. Appl. No. 13/728,177 mailed Feb. 10, 2014, pp. 1-13.
Office Action in commonly owned U.S. Appl. No. 13/332,788 mailed Nov. 28, 2012, pp. 1-8.
Final Office Action in commonly owned U.S. Appl. No. 13/332,788 mailed Jul. 25, 2013, pp. 1-12.
Office Action in commonly owned U.S. Appl. No. 13/915,655 mailed Mar. 5, 2014, pp. 1-8.
Notice of Allowance in commonly owned U.S. Appl. No. 13/728,177 mailed May 30, 2014, pp. 1-5.
Final Office Action in commonly owned U.S. Appl. No. 13/915,655 mailed Jun. 23, 2014, pp. 1-5.

* cited by examiner

*Primary Examiner* — Ling Choi
*Assistant Examiner* — Thuy-Ai Nguyen
(74) *Attorney, Agent, or Firm* — Additon, Higgins & Pendleton, P.A.

(57) ABSTRACT

A polyamide resin composition includes (A) a semi-aromatic polyamide resin, (B) an inorganic filler, (C) a white pigment and (D) a phosphinate salt. The polyamide resin composition can have excellent heat resistance, reflectance, photostability and/or discoloration resistance.

13 Claims, No Drawings

POLYAMIDE RESIN COMPOSITION HAVING EXCELLENT PHOTOSTABILITY AND DISCOLORATION RESISTANCE

CROSS-REFERENCE TO RELATED APPLICATION

This application claims priority under 35 USC Section 119 to and the benefit of Korean Patent Application No. 10-2013-0012017, filed Feb. 1, 2013, the entire disclosure of which is incorporated herein by reference.

FIELD OF THE INVENTION

The present invention relates to a polyamide resin composition that can have excellent heat resistance, reflectance, discoloration resistance, and/or photostability.

BACKGROUND OF THE INVENTION

Recently polyamide resin as an engineering plastic has been used as a material for parts of light emitting diodes (LEDs). Because LEDs have good energy efficiency and long life, LEDs can replace conventional light sources, and interest in LEDs has been rising. Polyamide resin can be used in LED parts such as reflectors, reflector cups, scramblers, housings, and the like. The polyamide resin can be a high heat resistant modified polyamide resin which is reinforced with glass fiber and comprises an aromatic ring as a part of its main chain.

However, in order to be used as a material for LED parts, the polyamide should resist heat generated during the manufacture of LEDs and have a high initial whiteness index and excellent reflectance. Simultaneously, consistent irradiation of the LED by light sources can cause yellowing, which reduces the whiteness index. Thus, deterioration of whiteness should be minimized. Also, the resin can block the flow of electricity.

LEDs generally include a semiconductor emitting a light, a lead wire, a reflector as a housing, and a transparent sealing product sealing the semiconductor parts. The reflector can be made of ceramic or heat resistance plastic. Ceramics, however, have problems with productivity. Also, in the case of heat resistance plastics, injection molding can heat harden the sealing material, and also optical reflectance can decrease due to changes in color that can occur in the environment in which the LED is used.

Korean Patent Publication No. 2007-7026437 discloses a polyamide resin composition stated to have excellent surface reflectance and heat resistance, which is prepared using inorganic fillers and white pigments. However, when the polyamide resin composition exposed to high temperature and high humidity, over time color can change and reflectance can deteriorate.

Accordingly, there is a need for a material to replace traditional ceramic or heat resistance plastics used in the production of LED parts, such as reflectors.

SUMMARY OF THE INVENTION

The present invention provides a polyamide resin composition that can have excellent heat resistance.

The present invention also provides a polyamide resin composition that can have excellent reflectance.

The present invention further provides a polyamide resin composition that can have excellent discoloration resistance.

The present invention further provides a polyamide resin composition that can have excellent photostability.

The present invention further provides a polyamide resin composition that can have excellent heat resistance, reflectance, discoloration resistance and/or photostability.

The polyamide resin composition in accordance with the present invention may comprise (A) a semi-aromatic polyamide resin, (B) an inorganic filler, (C) a white pigment and (D) a phosphinate salt.

The polyamide resin composition of the present invention may comprise (D) about 0.01 to about 5 parts by weight of the phosphinate salt based on about 100 parts by weight of a base resin composition comprising about 30 to about 80% by weight of the semi-aromatic polyamide resin (A), about 5 to about 30% by weight of the inorganic filler (B) and about 10 to about 60% by weight of the white pigment (C).

The polyamide resin composition of the present invention may further comprise (E) about 0.01 to about 2 parts by weight of a photostabilizer based on about 100 parts by weight of the base resin composition comprising the semi-aromatic polyamide resin (A), the inorganic filler (B), and the white pigment (C).

The semi-aromatic polyamide resin (A) may include a structure with a repeating unit, which is derived from diamine and dicarboxylic acid including aromatic dicarboxylic acid. The semi-aromatic polyamide resin (A) may include a repeating unit represented by Chemical Formula 3:

[Chemical Formula 3]

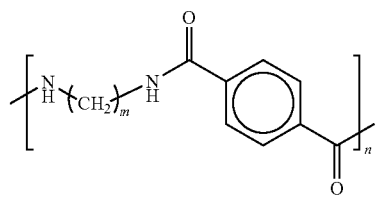

wherein m is an integer from 4 to 12, and n is an integer 10 to 500.

The semi-aromatic polyamide resin (A) may have a glass transition temperature of about 50 to about 200° C.

The semi-aromatic polyamide resin (A) may be a crystalline semi-aromatic polyamide resin and may have a melting point of about 260 to about 350° C.

Examples of the inorganic filler (B) may include without limitation carbon fibers, glass fibers, boron fibers, glass beads, glass flakes, carbon black, clays, kaoline, talc, mica, calcium carbonate, wollastonite, potassium titanate whisker, aluminum borate whisker, zinc oxide whisker, calcium whisker, and the like, and combinations thereof.

The inorganic filler (B) may be glass fibers having an average length of about 0.1 to about 20 mm and having an aspect ratio (L (average length of fibers)/D (average external diameter of fibers)) of about 10 to about 2,000.

The inorganic filler (B) may be wollastonite having an average length of about 0.1 to about 20 μm.

Examples of the white pigment (C) may include without limitation titanium oxide, zinc oxide, zinc sulfide, white lead, zinc sulfate, barium sulfate, calcium carbonate, aluminum oxide, and the like, and combinations thereof.

The phosphinate salt (D) is represented by Chemical Formula 4.

[Chemical Formula 4]

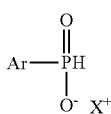

wherein Ar is substituted or unsubstituted C6 to C18 aryl, and X is a metal cation comprising Na, Ca, Mg, Al, or Zn.

The phosphinate salt (D) may be sodium phenyl phosphinate.

The polyamide resin composition of the present invention can have a heat deflection temperature (HDT) of about 200 to about 300° C. measured for a ¼ inch thick specimen under a load of 1.82 MPa in accordance with ASTM D648.

The polyamide resin composition may have an initial reflectance of about 93% or more, measured using a spectrophotometer at a wavelength of 440 nm. The polyamide resin composition have further exhibit a decrease in reflectance of less than about 13%, measured at a wavelength of 440 nm before and after exposing a specimen formed of the polyamide resin composition to a LED light source at 85° C. and a relative humidity of 85% for 250 hours. Also the polyamide resin composition may have an initial yellow index (YI) of about 3 to about 5, measured using a spectrophotometer, and a change of yellow index (ΔYI) of less than about 5, measured before and after leaving a specimen formed of the polyamide resin composition at 150° C. for 8 hours.

The present invention also provides molded articles prepared from the polyamide resin composition.

The molded articles prepared from the polyamide resin composition of the present invention may include a LED reflector.

The present invention can provide a polyamide resin composition that can have excellent heat resistance, reflectance, discoloration resistance and/or photostability.

DETAILED DESCRIPTION OF THE INVENTION

The present invention now will be described more fully hereinafter in the following detailed description of the invention in which some but not all embodiments of the invention are described. Indeed, this invention may be embodied in many different forms and should not be construed as limited to the embodiments set forth herein; rather, these embodiments are provided so that this disclosure will satisfy applicable legal requirements.

The present invention relates to a polyamide resin composition that can have excellent heat resistance, reflectance, discoloration resistance and/or photostability.

The polyamide resin composition of the present invention may comprise (A) a semi-aromatic polyamide resin, (B) an inorganic filler, (C) a white pigment, (D) a phosphinate salt.

The polyamide resin composition of the present invention may comprise (D) about 0.01 to about 5 parts by weight of the phosphinate salt based on about 100 parts by weight of a base resin composition comprising about 30 to about 80% by weight of the semi-aromatic polyamide resin (A), about 5 to about 30% by weight of the inorganic filler (B), and about 10 to about 60% by weight of the white pigment (C).

Detailed description of components of polyamide resin composition has been mentioned as follow.

(A) Semi-Aromatic Polyamide Resin

In present invention, a commercially available semi-aromatic polyamide resin (A) may be used without limitation. In addition, not only crystalline polyamide resin but also amorphous polyamide resin may be used as the semi-aromatic polyamide resin (A).

Non-limiting examples of the semi-aromatic polyamide resin (A) are as follows.

The semi-aromatic polyamide resin (A) of the present invention may include a structure with a repeating unit, which is derived from diamine and dicarboxylic acid including aromatic dicarboxylic acid.

The semi-aromatic polyamide resin (A) of the present invention may have a structure comprising aromatic rings in its main chain, and it may be prepared by condensation polymerization of dicarboxylic acid and a monomer. The dicarboxylic acid may comprise about 10 to about 100 mole % of aromatic dicarboxylic acid, and the monomer may comprise aliphatic diamine, alicyclic diamine, aromatic aliphatic diamine or a combination thereof. The diamine monomer may have 4 to 22 carbon atoms.

The aromatic dicarboxylic acid may comprise terephthalic acid and/or isophthalic acid, which may comprise an aromatic ring in their main chain. Terephthalic acid and isophthalic acid are represented by Chemical Formula 1 and 2, respectively, below:

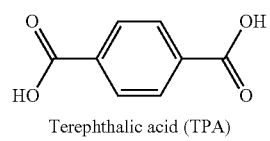

Terephthalic acid (TPA)

[Chemical Formula 1]

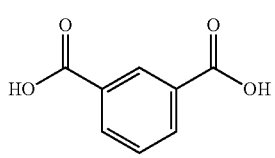

Isophthalic acid (IPA)

[Chemical Formula 2]

A representative semi-aromatic polyamide resin (A) may be represented by Chemical Formula 3 as below:

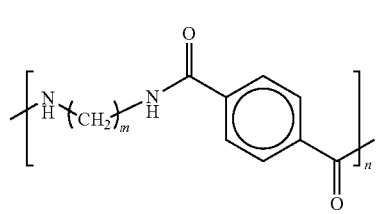

[Chemical Formula 3]

wherein m is an integer from 4 to 12, and n is an integer 10 to 500.

Examples of the semi-aromatic polyamide resin (A) may include without limitation PA6T, PA10T, and the like, and combinations thereof. PA6T may be prepared by condensation polymerization of hexamethylene diamine and terephthalic acid, and PA10T may be prepared by condensation polymerization of 1,10-decane diamine and terephthalic acid.

The semi-aromatic crystalline polyamide resin (A) of the present invention may have an aromatic ring in (as a part of) its main chain. Examples of the crystalline polyamide resin (A) may include without limitation poly(hexamethylene terephthalamide) (PA6T), polycaproamide/poly(hexamethylene terephthalamide) copolymer (PA6/6T), poly(hexamethylene adipamide)/poly(hexamethylene terephthalamide) copolymer (PA66/6T), poly(hexamethylene adipamide)/poly(hexamethylene isophthalamide) copolymer (PA66/6I), poly(hexamethylene terephthalamide)/poly(hexamethylene isophthalamide) copolymer (PA6T/6I), poly(hexamethylene terephthalamide)/polydodecanamide copolymer (PA6T/12), poly(hexamethylene adipamide)/poly(hexamethylene terephthalamide)/poly(hexamethylene isophthalamide) copolymer(PA66/6T/6I), poly(xylylene adipamide) (PAMXD6), poly(hexamethylene terephthalamide)/poly(2-methylpentamethylene terephthalamide) copolymer (PA6T/M5T), poly(nonamethylene terephthalamide)(PA9T), poly(decamethylene terephthalamide) (PA10T), poly(undecamethylene terephthalamide) (PA11T), poly(dodecamethylene terephthalamide) (PA12T) and the like, and combinations thereof.

Examples of amorphous polyamide resin which can be used as the semi-aromatic polyamide resin (A) are as follows.

The amorphous semi-aromatic polyamide resin may be prepared from following monomers. Examples of the monomers may include without limitation branched and/or linear aliphatic diamine having 6 to 14 carbon atoms, such as 1,6-hexamethylene diamine, 2-methyl-1,5-diaminopentane, 2,2,4-trimethylhexamethylene diamine, 2,4,4-trimethylhexamethylene diamine, 1,9-nonamethylene diamine, 1,10-decamethylene diamine, 1,12-dodecamethylene diamine, and the like, and combinations thereof, alicyclic diamine having 6 to 22 carbon atoms, such as 4,4'-diaminocyclohexylmethane, 3,3'-dimethyl-4,4'-diaminocyclohexylmethane, 4,4'-diaminodicyclopropane, 1-4-diaminocyclohexane, 1,4-bisaminomethylcyclohexane, 2,6-bisaminomethylnorbornane, 3-aminomethyl-3,5,5-trimethylcyclohexylamine, and the like, and combinations thereof, aromatic aliphatic diamine having 8 to 22 carbon atoms, such as m-xylene diamine, p-xylene diamine, bis(4-aminophenyl)propane, and the like, and combinations thereof, aromatic aliphatic dicarboxylic acid having 8 to 22 carbon atoms, such as 4,4'-diphenylmethane dicarboxylic acid, and the like, and combinations thereof, aromatic dicarboxylic acid having 8 to 22 carbon atoms, such as isophthalic acid, tributyl isophthalic acid, terephthalic acid, 1,4-naphthalene dicarboxylic acid, 1,5-naphthalene dicarboxylic acid, 2,6-naphthalene dicarboxylic acid, 2,7-naphthalene dicarboxylic acid, diphenic acid, diphenylether-4,4'-dicarboxylic acid, and the like, and the like, and combinations thereof, as well as combinations of any of the foregoing.

Examples of the amorphous semi-aromatic polyamide resin (A) may include without limitation polyamide prepared from terephthalic acid with 2,2,4-trimethylhexamethylene diamine or its isomer, i.e. 2,4,4-trimethylhexamethylene diamine; polyamide prepared from isophthalic acid with 1,6-hexamethlyene diamine; copolyamide prepared from terephthalic acid/isophthalic acid blend with 1,6-hexamethylene diamine; copolyamide prepared from isophthalic acid with 3,3'-dimethyl-4,4'-diaminodicyclohexylmethane, lauriclactam or lactam; copolyamide prepared from terephthalic acid/isophthalic acid blend with 3,3'-dimethyl-4,4'-diaminocyclohexylmethane or laurolactam.

The semi-aromatic polyamide resin (A) of the present invention may have a glass transition temperature of about 50 to about 200° C., for example about 70 to about 160° C., wherein the glass transition temperature is measured by DSC. When the semi-aromatic polyamide resin (A) of the present invention is a crystalline semi-aromatic polyamide resin, it may have melting point measured by DSC of about 260 to about 350° C., for example about 280 to about 340° C. Also, the crystalline semi-aromatic polyamide resin may have a crystallization temperature measured by DSC of about 220 to about 320° C., for example about 240 to about 300° C. Within these ranges, the semi-aromatic polyamide resin (A) can have excellent heat resistance.

The semi-aromatic polyamide resin (A) of the present invention may be included in an amount of about 30 to about 80% by weight based on 100% by weight of a base resin composition comprising the semi-aromatic polyamide resin (A), the inorganic filler (B) and the white pigment (C). In some embodiments, the base resin composition can include the semi-aromatic polyamide resin (A) in an amount of about 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, or 80% by weight. Further, according to some embodiments of the present invention, the semi-aromatic polyamide resin (A) may be present in an amount of from about any of the foregoing amounts to about any other of the foregoing amounts.

When the amount of the semi-aromatic polyamide resin (A) is less than about 30% by weight, moldability of the polyamide resin composition can be deteriorated. When the amount of the semi-aromatic polyamide resin (A) is more than about 80% by weight, discoloration resistance of the polyamide resin composition may be deteriorated.

(B) Inorganic Filler

In order to improve mechanical properties, heat resistance and dimensional stability of polyamide resin composition, an inorganic filler (B) having various particle shapes can be used.

Any of the generally known inorganic filler can be used in the present invention. Examples of the inorganic filler may include without limitation carbon fibers, boron fibers, glass beads, glass flakes, carbon black, clays, kaoline, talc, mica, calcium carbonate and the like, and combinations thereof. Examples of the needle-shaped filler may include without limitation glass fibers, wollastonite, potassium titanate whisker, aluminum borate whisker, zinc oxide whisker, calcium whisker and the like, and combinations thereof.

When the inorganic filler (B) is used in the resin composition, a molded product prepared from the resin composition can have improved mechanical properties, such as tensile strength, flexural strength, flexural modulus and the like, and improved heat resisting properties, such as heat deflection temperature and the like.

To provide high whiteness, wollastonite, glass fibers, potassium titanate whisker, and/or aluminum borate whisker can be used.

Further, an inorganic filler (B) coated a suitable organic material can be used in order to improve adhesion with polyamide resin. In exemplary embodiments, a glass fiber can be used. When using glass fiber, the resin composition can have improved moldability, and simultaneously a molded product prepared from the resin composition can have improved heat resistance, reflectance, discoloration resistance and/or photostability.

The average length of the glass fiber may be about 0.1 to about 20 mm. The aspect ratio of the glass fiber (L (average length of fibers)/D (average external diameter of fibers)) may be about 10 to about 2,000, for example about 30 to about 1,000. When using glass fiber with an average length and/or aspect ratio within the above ranges, impact strength of the resin composition may be substantially improved.

The glass fiber may have a circular cross section, although the present invention is not limited to glass fiber having a particular cross sectional shape. Accordingly, the cross section of glass fiber may be changeable and can be selected based on the particular application or end use of the composition.

In addition, in order to improve thin film moldability of the polyamide resin composition, wollastonite among needle-shaped fillers can be used as the inorganic filler (B). When wollastonite is used in the field of micromolding such as molding of a thin film having a thickness of about 1 mm or less, excellent heat resistance and mechanical properties of the base resin may be maintained, and also moldability of the resin composition may be ensured. The average length of the wollastonite may be about 0.1 to about 20 μm. Also, bulk density (tapped) of wollastonite may be about 0.1 to about 2 g/cm$^3$, for example about 0.1 to about 1 g/cm$^3$. Wollastonite may have a quadrangle cross section, although the present invention is not limited to wollastonite having a particular cross sectional shape. Accordingly, the cross section of the wollastonite may be changeable and can be selected based on the particular application or end use of the composition.

The base resin composition may include the inorganic filler (B) in an amount of about 5 to about 30% by weight based on about 100% by weight of the base resin composition comprising the semi-aromatic polyamide resin (A), the inorganic filler (B) and the white pigment (C). In some embodiments, the base resin composition can include the inorganic filler (B) in an amount of about 5, 6, 7, 8, 9, 10, 11, 12, 13, 14, 15, 16, 17, 18, 19, 20, 21, 22, 23, 24, 25, 26, 27, 28, 29, or 30% by weight. Further, according to some embodiments of the present invention, the inorganic filler (B) may be present in an amount of from about any of the foregoing amounts to about any other of the foregoing amounts.

When the amount of the inorganic filler (B) is less than about 5% by weight, mechanical properties and heat resisting property of the resin composition may be deteriorated. When the amount of the inorganic filler (B) is more than about 30% by weight, moldability of the resin composition may be deteriorated.

(C) White Pigment

In the present invention, in order to realize sufficient reflectance, a white pigment (C) can be used.

Examples of the white pigment (C) can include without limitation titanium oxide, zinc oxide, zinc sulfide, white lead, zinc sulfate, barium sulfate, calcium carbonate, aluminum oxide and the like. The white pigment (C) may be used alone or by combinations of at least two kinds of the white pigment. Also, the white pigment can be treated with a coupling agent, such as but not limited to silane coupling agent, titanium coupling agent and the like, and combinations thereof. For example, silane compounds, such as vinyltriethoxysilane, 3-aminopropyltriethoxysilane, 3-glycidoxypropyltriethoxysilane and the like, may be used for surface treatment of the white pigment.

In exemplary embodiments, titanium dioxide (TiO$_2$) may be used as the white pigment (C) of the present invention. Titanium dioxide can improve optical properties, such as reflectance, hiding property and the like. Any general titanium dioxide may be used, and its preparing methods and its diameter are not limited.

In exemplary embodiments, titanium dioxide surface-treated with inorganic and/or organic surface treatment agent can be used. Examples of the inorganic surface treatment agent may include without limitation aluminum oxide (alumina, Al$_2$O$_3$), silicone dioxide (silica, SiO$_2$), zircon dioxide (zirconia, ZrO$_2$), sodium silicate, sodium aluminate, sodium aluminum silicate, zinc oxide, mica and the like, and combinations thereof. Examples of the organic surface treatment agent may include without limitation polydimethylsiloxane, trimethylpropane (TMP), pentaerythritol and the like and combinations thereof. The titanium dioxide can be surface-treated with an inorganic and/or organic surface treatment agent in an amount of less than about 5 parts by weight based on about 100 parts by weight of titanium dioxide.

In the present invention, titanium dioxide which is coated with alumina (Al$_2$O$_3$) as inorganic surface treatment agent may be used. The titanium dioxide can be coated with alumina in an amount of less than about 5 parts by weight based on about 100 parts by weight of titanium dioxide.

In other embodiments, titanium dioxide surface-treated with alumina can be used after further reforming with inorganic surface treatment, such as silicon dioxide, zircon dioxide, sodium silicate, sodium aluminate, sodium aluminum silicate, mica and the like, and/or with an organic surface treatment, such as polydimethylsiloxane, trimethylpropane (TMP), pentaerythritol and the like.

The base resin composition may include the white pigment (C) in an amount of about 10 to about 60% by weight based on about 100% by weight of a base resin composition comprising the semi-aromatic polyamide resin (A), the inorganic filler (B), and the white pigment (C). In some embodiments, the base resin composition can include the white pigment (C) in an amount of about 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, or 60% by weight. Further, according to some embodiments of the present invention, the white pigment (C) may be present in an amount of from about any of the foregoing amounts to about any other of the foregoing amounts.

When the amount of the white pigment (C) is less than about 10% by weight, reflectance of the resin composition can be deteriorated. When the amount of the white pigment (C) is more than about 60% by weight, mechanical properties such as impact resistance can be deteriorated.

(D) Phosphinate Salt

In the present invention, in order to obtain sufficient heat stability and photostability, a phosphinate salt (D) may be used.

If polyamide resin is subjected to light and/or heat, radicals, double bonds, and/or acid can be formed, which can cause discoloration. Using the phosphinate salt (D) in the polyamide resin can prevent formation of the double bond, and the phosphinate salt can capture the acids formed when the amide bonds are broken. In the present invention, the polyamide resin composition can maintain high whiteness and can exhibit improved heat stability and photostability using the phosphinate salt (D), The phosphinate salt (D) of the present invention is represented as following Chemical Formula 4.

[Chemical Formula 4]

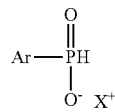

wherein Ar is substituted or unsubstituted C6 to C18 aryl, and X is a metal cation comprising Na, Ca, Mg, Al or Zn.

In the Chemical Formula 4, if Ar is a functional group having a smaller molecular weight than the phenyl group, heat stability of the phosphinate salt itself can be deteriorated, so a typical Ar is phenyl or naphthyl.

As used here, unless otherwise defined, the term "substituted" means that a hydrogen atom of the aryl is substituted with C1-C10 linear alkyl, C3 to C10 branched and/or cyclic alkyl, C1-C10 linear alkoxy, C3 to C10 branched and/or cyclic alkoxy, C1-C10 linear alkylthio, C3 to C10 branched and/or cyclic alkylthio, C1-C10 linear alkylamine, C3 to C10 branched and/or cyclic alkylamine, C6 to C18 aryl, C6 to C18 aryloxy, C6 to C18 arylthio, C6 to C18 arylamine group, halogen and the like, and combinations thereof.

In addition, X of the above Chemical Formula 4 may be Na or Al, for example Na.

In exemplary embodiments, sodium phenyl phosphinate can be used as the phosphinate salt (D) of the present invention.

The polyamide resin composition may include the phosphinate salt (D) in an amount of about 0.01 to about 5 parts by weight based on about 100 parts by weight of the base resin composition comprising the semi-aromatic polyamide resin (A), the inorganic filler (B) and the white pigment (C). In some embodiments, the polyamide resin composition may include the phosphinate salt (D) in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, 2, 3, 4, or 5 parts by weight. Further, according to some embodiments of the present invention, the phosphinate salt (D) may be present in an amount of from about any of the foregoing amounts to about any other of the foregoing amounts.

When the amount of the phosphinate salt (D) is less than about 0.01 parts by weight, heat stability and photostability of the resin composition can be deteriorated. When the amount of the phosphinate salt is more than about 5 parts by weight, a unimolecular form of the phosphinate salt (D) can emerge from a molded article surface made of the resin composition, so initial values of yellow index and reflectance can be deteriorated.

(E) Photostabilizer

The polyamide resin composition of the present invention may further comprise a photostabilizer (E) to prevent discoloration and to inhibit deterioration of reflectance.

Examples of the photostabilizer (E) may include without limitation compounds which can absorb ultraviolet rays, such as benzophenone compounds, salicylate compounds, benzotriazole compounds, acrylonitrile compounds, other compounds having resonance structure and the like, compounds which can capture radicals, such as hindered amine compounds, hindered phenol compounds and the like, and combinations of at least two kinds of the foregoing compounds.

In exemplary embodiments, compounds which can absorb ultraviolet rays and compounds which can capture radical together can be used together.

The polyamide resin composition may include the photostabilizer (E) in an amount of about 0.01 to about 2 parts by weight, for example about 0.1 to about 2 parts by weight, based on about 100 parts by weight of the base resin composition comprising the semi-aromatic polyamide resin (A), the inorganic filler (B) and the white pigment (C). In some embodiments, the polyamide resin composition may include the photostabilizer (E) in an amount of about 0.01, 0.02, 0.03, 0.04, 0.05, 0.06, 0.07, 0.08, 0.09, 0.1, 0.2, 0.3, 0.4, 0.5, 0.6, 0.7, 0.8, 0.9, 1, or 2 parts by weight. Further, according to some embodiments of the present invention, the photostabilizer (E) may be present in an amount of from about any of the foregoing amounts to about any other of the foregoing amounts.

When the photostabilizer (E) is used in an amount within the above range, the photostabilizer may prevent discoloration and inhibit deterioration of reflectance.

(F) Other Additives

The polyamide resin composition of the present invention may further comprise one or more other additives. Examples of the additives may include without limitation fluorescent whitening agents, lubricants, release agents, nucleating agents, antistatic agents, stabilizers, reinforcing agents, inorganic additives, colorants such as pigments and/or dyes, and the like, and combinations thereof.

The fluorescent whitening agent can be used to improve reflectance of the polyamide resin composition. Examples of the fluorescent whitening agent can include without limitation stilbene-bisbenzoxazole derives such as 4-(benzoxazol-2-ly)-4'-(5-methylbenzoxazol-2-ly)stilbene, 4,4'-bis(benzoxazol-2-yl)stilbene and the like, and combinations thereof.

Examples of the release agent can include without limitation fluorine-containing polymers, silicon oils, stearic acid metal salts, montanic acid metal salts, montanic acid ester waxes, polyethylene waxes, and the like, and combinations thereof.

Examples of nucleating agent can include without limitation talc, clay and the like, and combinations thereof.

The polyamide resin composition of the present invention can have a heat deflection temperature (HDT) of about 200 to about 300° C. measured for a ¼ inch thick specimen under a load of 1.82 MPa in accordance with ASTM D648.

In addition, the polyamide resin composition of the present invention can have an initial reflectance of about 93% or more, measured using a spectrophotometer at a wavelength of 440 nm, and a decrease of reflectance of less than about 13%, measured at a wavelength of 440 nm before and after leaving a specimen formed of the polyamide resin composition in the presence of a LED light source at 85° C. and a relative humidity of 85% for 250 hours. The polyamide resin composition of the present invention can also have an initial yellow index of about 3 to about 5 measured using a spectrophotometer, and a change in yellow index (ΔYI) of less than about 5, measured before and after leaving the specimen at 150° C. for 8 hours.

Thus, the polyamide resin composition of the present invention may be used as a material for molded articles which need excellent heat resistance, reflectance, discoloration resistance and/or photostability. Because the composition includes the phosphinate salt (D), the polyamide resin composition of the present invention may have excellent heat resistance, reflectance, discoloration resistance and/or photostability, and thus it can be used as a material for a LED reflector which is consistently exposed to high temperature and high humidity conditions.

While the polyamide resin composition of the present invention can be used for a LED reflector, it can also be used in the production of other articles that reflect light rays. For example, it may be used in a reflector for light emitting device such as electrical/electronic parts, indoor lighting, outdoor lighting, automotive lighting, display devices, head light and the like.

The present invention will be further defined in the following examples, which are intended for the purpose of illustration and are not to be construed as in any way limiting the scope of the present invention.

EXAMPLES

The particulars of each component used in Examples and Comparative Examples of the present invention are as follows:

(A) Semi-Aromatic Polyamide Resin

In Examples and Comparative Examples, crystalline semi-aromatic polyamide resin having an aromatic ring in its main chain, i.e. PA10T, is used, and it is prepared by condensation polymerization of terephthalic acid and 1,10-decanediamine. The semi-aromatic polyamide resin (A) has a melting point of 315° C., a crystallization temperature of 280° C. and a glass transition temperature of 120° C. which are measured using DSC.

(B) Inorganic Filler

Glass fiber (Product name: 910) manufactured by Owens Corning is used.

(C) White Pigment

Titanium dioxide (Product name: KRONOS 2233) manufactured by Kronos is used.

(D) Phosphinate Salt

Sodium phenyl phosphinate having the following structure is used.

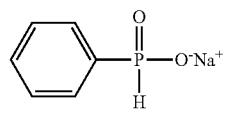

(E) Photostabilizer

Photostabilizer (Product name: CHIMASSORB 944) manufactured by BASF is used.

Examples 1 to 3 and Comparative Examples 1 to 3

The phosphinate salt (D) and/or photostabilizer (E) are added in the amounts set forth in the following Table 1 to a base resin composition comprising semi-aromatic polyamide resin (A), inorganic filler (B) and white pigment (C) to form a polyamide resin composition. The polyamide resin composition is extruded using a twin-screw extruder having L/D=35 and Φ=45 mm, and formed into pellets at a barrel temperature of 250 to 350° C. The manufactured pellets are dried at 100° C. for 4 hours or more, and then are used to form a specimen for evaluating heat resistance, yellow index and reflectance using a screw-type catapult with a cylinder temperature of 240 to 350° C.

In the following Table 1, (A), (B) and (C) are represented by % by weight based on 100% by weight of (A), (B) and (C); (D) and (E) are represented by parts by weight based on 100 parts by weight of (A), (B) and (C).

TABLE 1

|     | Examples |     |     | Comparative Examples |     |     |
|-----|----------|-----|-----|----------------------|-----|-----|
|     | 1        | 2   | 3   | 1                    | 2   | 3   |
| (A) | 65       | 65  | 50  | 65                   | 65  | 50  |
| (B) | 20       | 20  | 45  | 25                   | 25  | 45  |
| (C) | 15       | 15  | 5   | 10                   | 10  | 5   |
| (D) | 1        | 1   | 0.5 | —                    | —   | —   |
| (E) | —        | 0.5 | 0.5 | —                    | 0.5 | 0.5 |

Heat resistance, yellow index and reflectance of the specimens prepared in accordance with the amounts of Table 1 are evaluated and the results are shown in Table 2.

Methods for Evaluation of Physical Properties (1) Heat resistance: heat deflection temperature (HDT) is measured for a ¼ inch thick specimen under a load of 1.82 MPa in accordance with ASTM D648.

(2) Yellow index: Initial yellow index (YI) is measured using a spectrophotometer (Product name: 3600D CIE Lab. (Minolta)). The specimen is then left at a temperature of 150° C. for 8 hours, and the yellow index is measured again. Then the change in yellow index is evaluated.

(3) Reflectance: Initial reflectance (SCI, specular component included) is measured using a spectrophotometer (Product name: 3600D CIE Lab. (Minolta)) at a wavelength of 440 nm. The specimen is then left in a LED light source at 85° C. and a relative humidity of 85% for 250 hours, and reflectance is measured again. Then, decrease in reflectance is evaluated.

TABLE 2

|                  |                              | Examples |      |      | Comparative Examples |      |      |
|------------------|------------------------------|----------|------|------|----------------------|------|------|
|                  |                              | 1        | 2    | 3    | 1                    | 2    | 3    |
| heat resistance (° C.) |                        | 270      | 269  | 213  | 271                  | 270  | 214  |
| Yellow Index (−) | initial stage                | 4.0      | 3.6  | 3.1  | 6.7                  | 5.5  | 5.1  |
|                  | after 8 hours at 150° C.     | 8.6      | 7.9  | 8.0  | 12.5                 | 10.7 | 10.8 |
|                  | change of yellow index       | 4.6      | 4.3  | 4.9  | 5.8                  | 5.2  | 5.7  |
| Reflectance (%)  | initial stage                | 93.4     | 93.8 | 94.2 | 91.1                 | 92.8 | 93.5 |
|                  | after 250 hours at 85° C./85% RH, | 81.1 | 83.7 | 85.2 | 71.0                 | 73.4 | 75.9 |
|                  | change of reflectance        | 12.3     | 10.1 | 9.0  | 20.1                 | 19.4 | 17.6 |

As shown in Table 2, the polyamide resin compositions of Examples 1 to 3 have excellent heat resistance, reflectance, discoloration resistance and photostability. On the other hand, in Comparative Examples 1 to 3 which do not include phosphinate salt (D), reflectance and discoloration resistance are deteriorated.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A polyamide resin composition comprising (A) a semi-aromatic polyamide resin; (B) an inorganic filler; (C) a white pigment; and (D) a phosphinate salt, wherein the phosphinate salt (D) is represented by Chemical Formula 4:

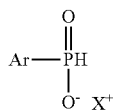

[Chemical Formula 4]

wherein Ar is substituted or unsubstituted C6 to C18 aryl, and X is a metal cation comprising Na, Ca, Mg, Al, or Zn, and wherein the polyamide resin composition has an initial reflectance of about 93% or more, measured using a spectrophotometer at a wavelength of 440 nm, a decrease in reflectance of less than about 13% measured at a wavelength of 440 nm as measured before and after leaving a specimen formed of the polyamide resin composition in a LED light source at 85 ° C. and a relative humidity of 85% for 250 hours, an initial yellow index (YI) of about 3 to about 5 measured with a spectrophotometer, and a change of yellow index (ΔYI) of less than about 5 measured before and after leaving a specimen formed of the polyamide resin composition at 150 ° C. for 8 hours.

2. The polyamide resin composition of claim 1, wherein the polyamide resin composition comprises (D) about 0.01 to about 5 parts by weight of the phosphinate salt based on about 100 parts by weight of a base resin composition comprising about 30 to about 80% by weight of the semi-aromatic polyamide resin (A); about 5 to about 30% by weight of the inorganic filler (B); and about 10 to about 60% by weight of the white pigment (C).

3. The polyamide resin composition of claim 2, wherein the polyamide resin composition further comprises (E) about 0.01 to about 2 parts by weight of a photostabilizer based on about 100 parts by weight of the base resin composition comprising the semi-aromatic polyamide resin (A), the inorganic filler (B), and the white pigment (C).

4. The polyamide resin composition of claim 1, wherein the semi-aromatic polyamide resin (A) includes a structure with a repeating unit derived from diamine and dicarboxylic acid including aromatic dicarboxylic acid.

5. The polyamide resin composition of claim 1, wherein the semi-aromatic polyamide resin (A) includes a repeating unit represented by Chemical Formula 3:

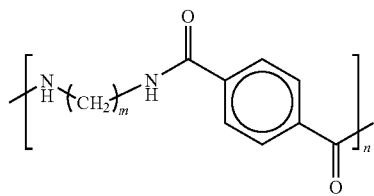

[Chemical Formula 3]

wherein m is an integer from 4 to 12, and n is an integer 10 to 500.

6. The polyamide resin composition of claim 1, wherein the semi-aromatic polyamide resin (A) is crystalline semi-aromatic polyamide resin, and has a melting point of about 260 to about 350 ° C.

7. The polyamide resin composition of claim 1, wherein the inorganic filler (B) comprises carbon fibers, glass fibers, boron fibers, glass beads, glass flakes, carbon black, clays, kaoline, talc, mica, calcium carbonate, wollastonite, potassium titanate whisker, aluminum borate whisker, zinc oxide whisker, calcium whisker, or a combination thereof.

8. The polyamide resin composition of claim 7, wherein the inorganic filler (B) is a glass fiber having an average length of about 0.1 to about 20 mm and an aspect ratio (L (average length of fibers)/D (average external diameter of fibers)) of about 10 to about 2,000.

9. The polyamide resin composition of claim 7, wherein the inorganic filler (B) is wollastonite having an average length of about 0.1 to about 20 μm.

10. The polyamide resin composition of claim 1, wherein the white pigment (C) comprises titanium oxide, zinc oxide, zinc sulfide, white lead, zinc sulfate, barium sulfate, calcium carbonate, aluminum oxide, or a combination thereof.

11. The polyamide resin composition of claim 1, wherein the phosphinate salt (D) is sodium phenyl phosphinate.

12. A molded article prepared from the polyamide resin composition of claim 1.

13. The molded article of claim 12, wherein the molded article is a LED reflector.

* * * * *